United States Patent [19]
Borkar

[11] Patent Number: 5,943,270
[45] Date of Patent: Aug. 24, 1999

[54] TWO-TRANSISTOR DRAM CELL FOR LOGIC PROCESS TECHNOLOGY

[75] Inventor: Shekhar Yeshwant Borkar, Beaverton, Oreg.

[73] Assignee: Intel Corporation, Santa Clara, Calif.

[21] Appl. No.: 08/979,501

[22] Filed: Nov. 26, 1997

[51] Int. Cl.[6] ................................................. G11C 16/04
[52] U.S. Cl. ............................... 365/189.01; 365/189.04; 365/104
[58] Field of Search .............................. 365/189.11, 188, 365/203, 104, 189.01, 189.02

[56] References Cited

U.S. PATENT DOCUMENTS 5,112,986 5/1992 Lim ...................................... 365/189.11
5,262,988 11/1993 Ochii ......................................... 365/188

*Primary Examiner*—David Nelms
*Assistant Examiner*—Thong Le
*Attorney, Agent, or Firm*—Arnold, White & Durkee

[57] ABSTRACT

A DRAM cell is provided which includes a read bit line capable of being precharged to a first voltage level, a write bit line capable of carrying data, a read word line capable of being asserted at a second voltage level, and a write word line capable of being asserted at about the first voltage level. A first switching device having an enable input is coupled between the read bit line and the word read line. A second switching device having an enable input coupled to the write word line is coupled between the write bit line and the enable input of the first switching device.

21 Claims, 2 Drawing Sheets

TWO-TRANSISTOR DRAM CELL FOR LOGIC PROCESS TECHNOLOGY

BACKGROUND OF THE INVENTION

1. Field of the Invention

This invention relates generally to dynamic random access memory (DRAM), and, more particularly, to a two-transistor DRAM cell for logic process technology.

2. Description of the Related Art

The demand for quicker and more powerful personal computers has led to many technological advances in the computer industry, including the development of more efficient dynamic random access memories. However, logic designers continue to strive to improve the memory (bit) density of a chip implemented in logic process technology.

Today, DRAM cells implemented on a chip used in a logic process can be fabricated using DRAM technology or logic process technology. The recent trend in the DRAM technology has been to fabricate a DRAM cell utilizing one transistor coupled to a capacitor. The logic process technology, on the other hand, utilizes three transistors to construct a DRAM cell. The single-transistor DRAM technology offers a higher memory bit density than the three-transistor DRAM of the logic process technology. But, because of performance and economic concerns, it is often desirable to construct the three-transistor dynamic memory using the logic process technology.

The prior art method of implementing a dynamic memory in a logic process requires the use of three transistors. FIGS. 1A and 1B illustrate two possible prior art configurations of a dynamic memory cell 5, 100. The illustration in FIG. 1A differs in one respect from that of FIG. 1B in that the dynamic memory cell 5 depicted in FIG. 1A utilizes a read and write bit line 10, 15 for respective read and write operations, whereas in FIG. 1B the dynamic memory cell 100 utilizes a common read and write bit line 105 for the read as well as the write operation.

The dynamic memory cell 5 of FIG. 1A includes a first, second, and third metal-oxide-semiconductor field-effect transistor (MOSFET) 20, 25, 30, a read and write word line 35, 40, and the read and write bit lines 10, 15. A source terminal of the first transistor 20 is coupled to the write bit line 15, while its gate terminal is coupled to the write word line 40. A drain terminal of the first transistor 20 is coupled to a gate terminal of the second transistor 25. Further, a source terminal of the second transistor 25 is coupled to ground, and its drain terminal is coupled to a source terminal of the third transistor 30. The gate terminal of the third transistor 30 is coupled to the read word line 35 while the drain terminal of the third transistor 30 is coupled to the read bit line 10.

The dynamic memory cell 100 of FIG. 1B includes a first, second, and third metal-oxide-semiconductor field-effect transistor (MOSFET) 110, 115, 120, a read and write word line 125, 130, and the common read and write bit line 105. A source terminal of the first transistor 110 is coupled to the common read and write bit line 105, while its gate terminal is coupled to the write word line 130. A drain terminal of the first transistor 110 is coupled to a gate terminal of the second transistor 115. Further, a source terminal of the second transistor 115 is coupled to ground and its drain terminal is coupled to a source terminal of the third transistor 120. The gate terminal of the third transistor 120 is coupled to the read word line 125 while the drain terminal of the third transistor 120 is coupled to the common read and write bit line 105.

The dynamic memory cells 5, 100 of FIGS. 1A and 1B operate in a similar manner. In both cases, the gates of the second transistors 25, 115 store the charge when the write word lines 40, 130 are activated. The charge is retained due to the inherent capacitance of the gate terminals of the second transistors 25, 115. Once the data is stored in the gate terminals of the second transistors 25, 115, it can be later retrieved by first precharging the read bit lines 10, 105 prior to the read operation and then asserting the read word lines 35, 125. Depending on the charge stored on the gate terminals of the second transistors 25, 115, the read bit lines 10, 105 are either pulled low or kept precharged. The third transistors 30, 120 are used as "amplifiers" to read the stored data from the second transistors 25, 115. The above described operation of the three-transistor dynamic memory cells 5, 100 is well known in the art.

While the above dynamic memory cells 5, 100 having three transistor are capable of storing data, they still suffer from several shortcomings. A three-transistor dynamic memory cell not only has a low memory bit density but also consumes substantial power. Thus, what is needed is smaller dynamic memory cell that consumes less power than the conventional three-transistor dynamic memory cell.

The present invention is directed to overcoming, or at least reducing the effects of, one or more of the problems set forth above.

SUMMARY OF THE INVENTION

In one aspect of the present invention, a DRAM cell includes a read bit line capable of being precharged to a first voltage level, a write bit line capable of carrying data, a read word line capable of being asserted at a second voltage level, and a write word line capable of being asserted at about the first voltage level. A first switching device having an enable input is coupled between the read bit line and the word read line. A second switching device having an enable input coupled to the write word line is coupled between the write bit line and the enable input of the first switching device.

In another aspect of the present invention, a method is provided for reading a DRAM cell, the DRAM cell including a read bit line, a read word line, and a switching device adapted for storing a charge capable of activating the switching device, the switching device connected between the read bit line and the read word line. The method includes precharging the read bit line to a first voltage level, asserting the read word line with a second voltage level, and pulling the read bit line toward substantially the second voltage level of the read word line in response to the charge activating the switching device.

BRIEF DESCRIPTION OF THE DRAWINGS

Other objects and advantages of the invention will become apparent upon reading the following detailed description and upon reference to the drawings in which.

Figure 1A:
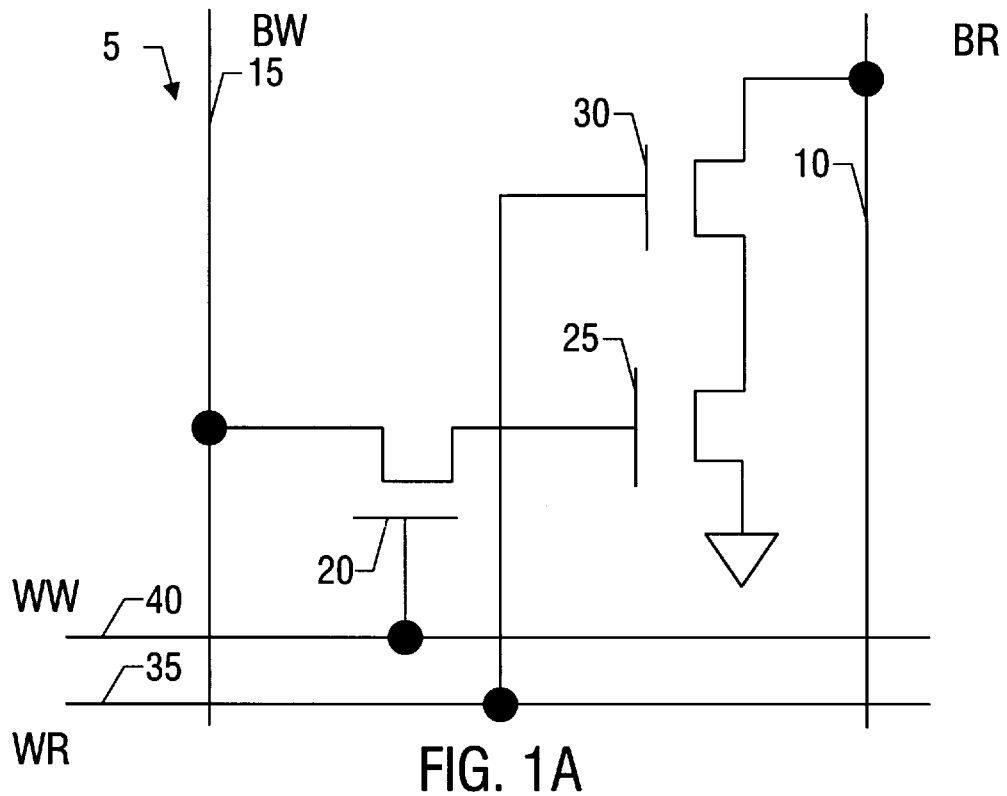
FIGS. 1A and 1B illustrate a schematic diagram of a prior art DRAM cell.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2:
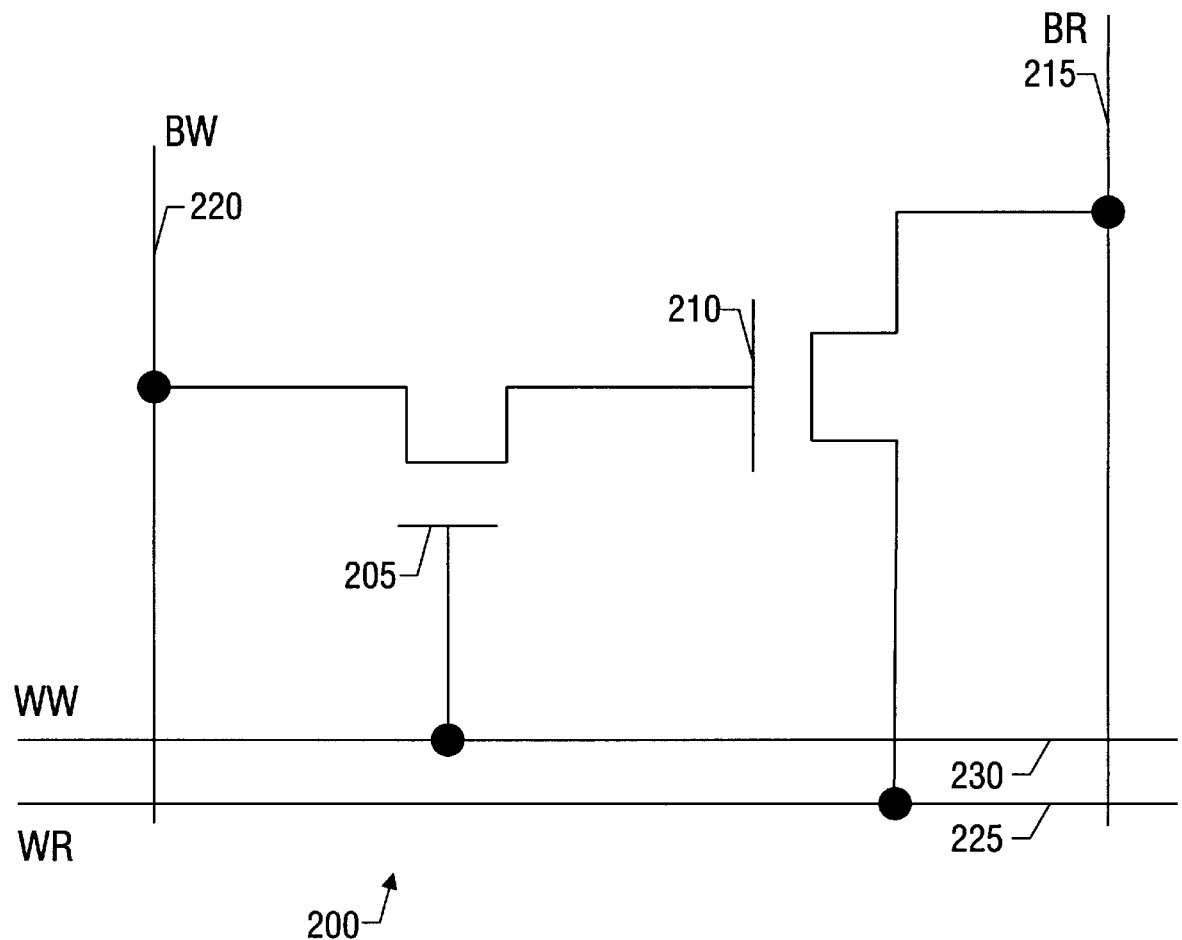
FIG. 2 illustrates a schematic diagram of a DRAM cell in accordance with the method and apparatus of the present invention.

Referring now to the drawings, and in particular to FIG. 2, there is shown a schematic diagram of one embodiment of the present invention, which includes a first and second transistor 205, 210, a read and write bit line 215, 220, and a read and write word line 225, 230.

A gate of the first transistor 205 is coupled to the write word line 230, while a source terminal of the first transistor 205 is coupled to the write bit line 220. A drain terminal of the first transistor 205 is coupled to a gate terminal of a second transistor 210. A source terminal of the second transistor 210 is coupled to the read word line 225, while a drain terminal of the second transistor 210 is coupled to the read bit line 215.

To write data (a logic 0 or 1, when logic 0 is about ground, and logic 1 is about $V_{dd}$) to the dynamic memory cell 200, the data is first placed on the write bit line 220 and then the write word line 230 is asserted. When the write word line 230 is asserted, the first transistor 205 is turned "on," and the data is transferred from the write bit line 220 to the gate terminal of the second transistor 210. This stores either substantially zero volts, if the data is a logic zero, or ($V_{dd}-V_t$) volts, if the data is a logic one, on the gate terminal of the second transistor 210 ($V_{dd}$ is the supply voltage and $V_t$ is the threshold voltage of the first transistor 205). After a write operation, the data is retained on the gate terminal of the second transistor 210 due to the inherent capacitance of the gate terminal of the second transistor 210.

To read data from the random access memory cell 200, the read bit line 215 is first precharged to $V_{dd}$ and then the read word line 225 is asserted by making it a logic 0. If a logic 0 is stored on the gate terminal of the second transistor 210, then the second transistor 210 is turned "off." This keeps the read bit line 215 unaffected, that is, it stays precharged to $V_{dd}$. On the other hand, if a logic 1 is stored on the gate terminal of the second transistor 210, then the second transistor 210 is turned "on," and it starts discharging the read bit line 215 through the read word line 225. The voltage level of the read bit line 215 starts falling. However, because it is clamped, it is allowed to fall to a level of substantially $V_{dd}-2V_t$ volts, which is enough to detect a logic 1 stored in the dynamic memory cell 200.

Those skilled in the art will appreciate that the dynamic memory cell 200 having two transistors of the present invention can also be employed in a system having a common read and write bit line. In a system having a common read and write bit line, the drain terminal of the second transistor 210 would be coupled to the common read and write bit line.

While FIG. 2 illustrates a dynamic memory cell 200 comprising two n-channel MOSFETs 205, 210, it should be apparent to those skilled in the art that p-channel MOSFETs (not shown) can also be employed in the present invention. To read data from a dynamic memory cell comprising two p-channel MOSFETs, the read bit line 215 would first be precharged low, and then the read word line 225 would be asserted by making it high. If a logic 1 is stored on the gate terminal of the p-channel MOSFET, then it is turned "off." This keeps the read bit line 215 unaffected, that is, it stays low. On the other hand, if a logic 0 is stored on the gate terminal of the p-channel MOSFET, then it is turned "on," and it starts to pull up the read bit line 215 to substantially the same voltage as the read word line 225. Essentially, the dynamic memory cell functions in a similar manner as the dynamic memory cell 200 of FIG. 2, except the polarities on the read bit line 215 and the read word line 225 are reversed.

Figure 1B:
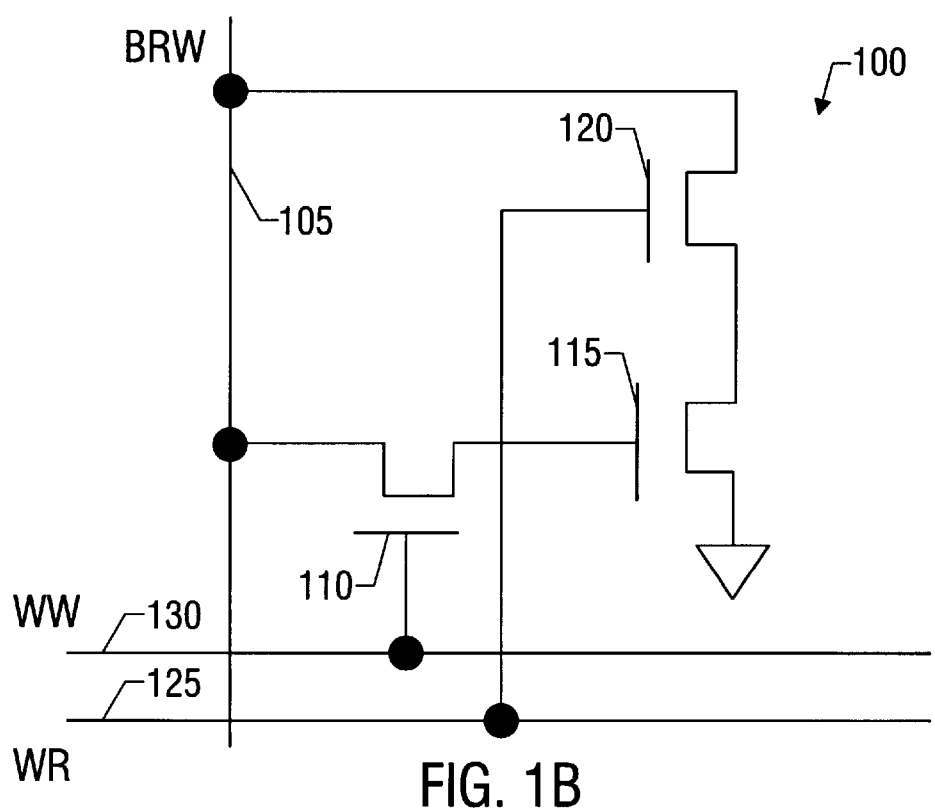

As shown in FIG. 2, the present invention eliminates the need of the third transistor of the prior art (30, 120—see FIGS. 1A and 1B), which serves as an amplifier in a conventional dynamic memory cell (5, 100—see FIGS. 1A and 1B). The present invention utilizes the second transistor 210 as a storage element to store the charge as well as an amplifier to read the stored value from the gate terminal of the second transistor 210. By eliminating one of the transistors, the dynamic memory cell 200 of the present invention is approximately 33 percent smaller than the conventional memory cells 5, 100 used in logic process technology. As a result, the present invention can be utilized to construct large cache memories, graphics memories, and other embedded memories on a high performance chip fabricated in logic process technology.

The dynamic random memory cell 200 of the present invention has been implemented using MOSFETs. However, it is envisioned that switching devices or other types of transistors with positive or negative doping can also be utilized without departing from the spirit and scope of the present invention.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

I claim:

1. A method for reading a DRAM cell, the DRAM cell including a bit line, a read word line, a write word line adjacent the read word line, the write word line capable of being asserted at about a first voltage level, and a switching device adapted for storing a charge capable of activating the switching device, the switching device connected between the bit line and the read word line without being disposed between the read word line and the write word line, the method comprising:

precharging the bit line to the first voltage level;

asserting the read word line with a second voltage level; and pulling the bit line toward substantially the second voltage level of the read word line if the switching device has been activated.

2. The method of claim 1, wherein the act of activating a switching device includes placing a signal having a voltage level of about $V_t$ on an input of an n-channel MOSFET.

3. The method of claim 2, wherein the first voltage level is a logically high voltage level of substantially $V_{dd}$.

4. The method of claim 2, wherein the second voltage level is substantially zero.

5. The method of claim 3, wherein the act of pulling includes pulling the bit line to substantially $V_{dd} - 2 V_t$ volts.

6. The method of claim 1, wherein the act of activating a switching device includes placing a signal having a voltage level on an input of a p-channel MOSFET to activate the p-channel MOSFET.

7. The method of claim 6, wherein the first voltage level is substantially zero.

8. The method of claim 6, wherein the second voltage level is substantially $V_{dd}$.

9. A DRAM cell comprising:
  a read bit line capable of being precharged to a first voltage level;
  a write bit line capable of carrying data;
  a read word line capable of being asserted at a second voltage level;
  a write word line adjacent the read word line, the write word line capable of being asserted at about the first voltage level;
  a first switching device having an enable input, the first switching device coupled between the read bit line and the read word line; and
  a second switching device having an enable input coupled to the write word line, the second switching device coupled between the write bit line and the enable input of the first switching device, wherein the first and second switching devices are not disposed between the read and write word lines.

10. The DRAM cell of claim 9, wherein the first and second switching devices each include an n-channel MOSFET.

11. The DRAM cell of claim 10, wherein the first voltage level is substantially $V_{dd}$.

12. The DRAM cell of claim 10, wherein the second voltage level is substantially zero.

13. The DRAM cell of claim 9, wherein the first and second switching devices each include a p-channel MOSFET.

14. The DRAM cell of claim 13, wherein the first voltage level is substantially zero.

15. The DRAM cell of claim 13, wherein the second voltage level is substantially $V_{dd}$.

16. A DRAM cell comprising:
  a common read and write bit line capable of being precharged to a first voltage level and capable of carrying data;
  a read word line capable of being asserted at a second voltage level;
  a write word line adjacent the read word line, the write word line capable of being asserted at about the first voltage level;
  a first switching device having an enable input, the first switching device coupled between the common read and write bit line and the read word line; and
  a second switching device having an enable input coupled to the write word line, the second switching device coupled between the common read and write bit line and the enable input of the first switching device, wherein the first and second switching devices are not disposed between the read and write word lines.

17. The DRAM cell of claim 16, wherein the first and second switching devices each include a p-channel MOSFET.

18. The DRAM cell of claim 17, wherein the second voltage level is substantially $V_{dd}$.

19. The DRAM cell of claim 16, wherein the first and second switching devices each include an n-channel MOSFET.

20. The DRAM cell of claim 19, wherein the first voltage level is substantially $V_{dd}$.

21. The DRAM cell of claim 19, wherein the second voltage level is substantially zero.

* * * * *